United States Patent
Ha et al.

(10) Patent No.: US 8,513,051 B2
(45) Date of Patent: Aug. 20, 2013

(54) METHODS OF FORMING PHASE-CHANGEABLE MEMORY DEVICES INCLUDING AN ADIABATIC LAYER

(75) Inventors: Yong-Ho Ha, Gyeonggi-do (KR); Bong-Jin Kuh, Gyeonggi-do (KR); Ji-Hye Yi, Gyeonggi-do (KR); Jun-Soo Bae, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 757 days.

(21) Appl. No.: 12/708,742

(22) Filed: Feb. 19, 2010

(65) Prior Publication Data
US 2010/0144087 A1    Jun. 10, 2010

Related U.S. Application Data

(63) Continuation of application No. 11/193,961, filed on Jul. 29, 2005, now Pat. No. 7,692,176.

(30) Foreign Application Priority Data

Aug. 17, 2004   (KR) .................................. 2004-64844

(51) Int. Cl.
*H01L 21/8239*   (2006.01)

(52) U.S. Cl.
USPC .................................. 438/102; 257/E21.645

(58) Field of Classification Search
USPC ................ 438/102, 3, 95; 257/3–5, 613–614
See application file for complete search history.

(56) References Cited

U.S. PATENT DOCUMENTS

| | | | |
|---|---|---|---|
| 6,507,061 B1 | 1/2003 | Hudgens et al. | 257/295 |
| 6,545,903 B1 | 4/2003 | Wu | 365/148 |
| 6,579,760 B1 | 6/2003 | Lung | 438/257 |
| 6,586,761 B2 | 7/2003 | Lowrey | 257/3 |
| 6,621,096 B2 | 9/2003 | Lee et al. | 257/10 |
| 6,649,928 B2 | 11/2003 | Dennison | 257/4 |
| 6,674,115 B2 | 1/2004 | Hudgens et al. | 257/310 |
| 6,927,410 B2 * | 8/2005 | Chen | 257/2 |
| 6,998,289 B2 | 2/2006 | Hudgens et al. | 438/95 |
| 7,391,050 B2 | 6/2008 | Happ | 257/52 |
| 7,417,245 B2 | 8/2008 | Happ et al. | 257/2 |
| 2003/0071289 A1 | 4/2003 | Hudgens et al. | 257/246 |
| 2005/0111247 A1 * | 5/2005 | Takaura et al. | 365/2 |
| 2006/0018156 A1 | 1/2006 | Happ | 365/185.05 |

OTHER PUBLICATIONS

Wikipedia entry for Group (periodic table), http://en.wikipedia.org/wiki/Periodic_table_group, Oct. 24, 2007.
Meinders (J. Mater. Res., vol. 16, No. 9, pp. 2530-2543).
McConnell et al. (J. Microelectromech. Sys., vol. 10, No. 3, pp. 360-369).
Raty et al. (PRL, vol. 85, No. 9, pp. 1950-1953).
Bo et al. (Chin. Phys., vol. 11, No. 3, pp. 293-297).

* cited by examiner

*Primary Examiner* — Savitr Mulpuri
(74) *Attorney, Agent, or Firm* — Myers Bigel Sibley & Sajovec

(57) ABSTRACT

Phase-changeable memory devices include a lower electrode electrically connected to an impurity region of a transistor in a substrate and a programming layer pattern including a first phase-changeable material on the lower electrode. An adiabatic layer pattern including a material having a lower thermal conductivity than the first phase-changeable material is on the programming layer pattern and an upper electrode is on the adiabatic layer pattern.

9 Claims, 15 Drawing Sheets

METHODS OF FORMING PHASE-CHANGEABLE MEMORY DEVICES INCLUDING AN ADIABATIC LAYER

CROSS REFERENCE TO RELATED APPLICATION

This application is a continuation of U.S. patent application Ser. No. 11/193,961 filed Jul. 29, 2005 now U.S. Pat. No. 7,692,176 which claims priority under 35 USC §119 from Korean Patent Application No. 2004-64844, filed on Aug. 17, 2004, the contents of which are hereby incorporated herein by reference in their entireties.

BACKGROUND OF THE INVENTION

The present invention relates to memory devices and methods of manufacturing the same. More particularly, the present invention relates to phase-changeable memory devices and methods of manufacturing the same.

Currently available memory devices include a dynamic random access memory (DRAM) device, a static random access memory (SRAM) device, a flash memory device and the like. Memory devices are generally classified as either volatile or non-volatile memory devices based on whether they keep or lose data when a current/power is not provided to the memory devices. When it is desired to maintain data when no current is being provided, a non-volatile memory device, in particular, a flash memory device, is widely used as a data-storing memory. However, as a flash memory device is typically not a random access memory device, a time required for reading/writing data to the flash memory may be longer than desired. As such, in some applications, a ferro-electric RAM, a magnetic RAM, a phase-changeable RAM (PRAM) or the like have been proposed as a next generation memory device.

The PRAM generally writes and reads data using a phase-changeable material that has a crystalline structure that may have its phase changed into an amorphous structure, typically by the application of heat. An example of a suitable phase-changeable material includes chalcogenides having germanium (Ge), stibium (Sb) and tellurium (Te). Examples of phase-changeable memory devices are described in U.S. Pat. Nos. 6,586,761, 6,649,928, 6,579,760 and 6,621,096.

In a unit cell of a phase-changeable memory device, a gate structure serving as a word line is generally formed on a semiconductor substrate. Source/drain regions are formed in portions of the semiconductor substrate at both sides of the gate structure. A lower wiring is electrically connected to one of the source/drain regions. A lower electrode is electrically connected to another of the source/drain regions. A phase-changeable layer pattern makes contact with the lower electrode. Upper electrodes are formed on the phase-changeable layer pattern. An upper wiring is connected between the upper electrodes.

A current is typically flowed into the phase-changeable layer pattern to provide heat to the phase-changeable layer pattern. The crystalline structure of the phase-changeable layer pattern is changed into the amorphous structure and vice versa in accordance with an amount and a provided time of the current so that a data "0" or "1" may be written in the cell.

A phase-changeable material may have a resistance that varies significantly based on the crystal structure of the phase-changeable material. Thus, when a current is provided to the phase-changeable material, the amount of the current flowing in the phase-changeable material may greatly vary depending on the crystal structure of the phase-changeable material. The data state of "0" or "1" in the cell may be read by detecting a difference between the amounts of the current that flow during a read operation.

In a phase-changeable memory device, although only a small amount of current may be provided to the phase-changeable layer pattern, it would still be desirable to rapidly change the crystal structure of the phase-changeable material. To facilitate heating and phase change, the phase-changeable layer pattern may be formed to limit/prevent heat loss. The loss of heat may generally mainly occur at the upper electrode. Thus, to suppress such a heat loss, forming the phase-changeable layer pattern to have a relatively high thickness may be desired.

However, when the phase-changeable layer pattern has a thick thickness, a region in which the crystalline structure of the phase-changeable material is changed into the amorphous structure and vice versa to program the data may be greatly widened. Therefore, because a large amount of current may then be required to sufficiently crystallize the phase-changeable layer pattern, it may be difficult to crystallize the phase-changeable material. The crystallized phase-changeable layer pattern having a thick thickness generally has a high resistance (generally referred to as a set resistance). When the crystallized phase-changeable layer pattern has a high set resistance, a difference between the set resistance of the crystallized phase-changeable layer pattern and a reset resistance of the amorphous phase-changeable layer pattern may be reduced, which may cause the data state to be more difficult to discriminated.

SUMMARY OF THE INVENTION

Embodiments of phase-changeable memory devices include a lower electrode electrically connected to an impurity region of a transistor in a substrate and a programming layer pattern including a first phase-changeable material on the lower electrode. An adiabatic layer pattern including a material having a lower thermal conductivity than the first phase-changeable material is on the programming layer pattern and an upper electrode is on the adiabatic layer pattern. The transistor may include first and second impurity regions of a substrate and a gate structure on a portion of the substrate between the first and second impurity regions. The lower electrode may be electrically connected to the second impurity region and a wiring line may be electrically connected to the first impurity region. The adiabatic layer pattern may be a conductive material.

In other embodiments, the adiabatic layer pattern is a second phase-changeable material having a melting point higher than that of the first phase-changeable material. The second phase-changeable material of the adiabatic layer pattern may have a melting point no less than about 50° C. higher than a melting point of the first phase-changeable material. The second phase-changeable material may be chalcogenide.

In further embodiments, the first phase-changeable material may be an element in Group VA-antimony-tellurium that includes germanium-antimony-tellurium (Ge—Sb—Te), arsenic-antimony-tellurium (As—Sb—Te), tin-antimony-tellurium (Sn—Sb—Te), silicon-germanium-antimony-tellurium (Si—Ge—Sb—Te), tin-indium-antimony-tellurium (Sn—In—Sb—Te), nitrogen-germanium-antimony-tellurium (N—Ge—Sb—Te), arsenic-germanium-antimony-tellurium (As—Ge—Sb—Te), tantalum-antimony-tellurium (Ta—Sb—Te), niobium-antimony-tellurium (Nb—Sb—Te) and/or vanadium-antimony-tellurium (V—Sb—Te), and/or an element in Group VA-antimony-selenium that includes tantalum-antimony-selenium (Ta—Sb—Se) niobium-antimony-selenium (Nb—Sb—Se) and/or vanadium-antimony-selenium (V—Sb—Se), and/or an element in Group VIA-antimony-tellurium that includes tungsten-antimony-tellurium (W—Sb—Te), molybdenum-antimony-tellurium (Mo—Sb—Te) and/or chrome-antimony-tellurium (Cr—Sb—Te), and/or an element in Group VIA-antimony-selenium that includes tungsten-antimony-selenium (W—Sb—Se), molybdenum-antimony-selenium (Mo—Sb—Se) and/or chrome-antimony-selenium (Cr—Sb—Se).

In other embodiments, the first phase-changeable material includes at least one material selected from the group consisting of an element in Group VA-antimony-tellurium, an element in Group VA-antimony-selenium, an element in Group VIA-antimony-tellurium, and an element in Group VIA-antimony-selenium. The element in Group VA-antimony-tellurium may include germanium-antimony-tellurium (Ge—Sb—Te), arsenic-antimony-tellurium (As—Sb—Te), tin-antimony-tellurium (Sn—Sb—Te), silicon-germanium-antimony-tellurium (Si—Ge—Sb—Te), tin-indium-antimony-tellurium (Sn—In—Sb—Te), nitrogen-germanium-antimony-tellurium (N—Ge—Sb—Te), arsenic-germanium-antimony-tellurium (As—Ge—Sb—Te), tantalum-antimony-tellurium (Ta—Sb—Te), niobium-antimony-tellurium (Nb—Sb—Te) and/or vanadium-antimony-tellurium (V—Sb—Te). The element in Group VA-antimony-selenium may include tantalum-antimony-selenium (Ta—Sb—Se) niobium-antimony-selenium (Nb—Sb—Se) and/or vanadium-antimony-selenium (V—Sb—Se). The element in Group VIA-antimony-tellurium may include tungsten-antimony-tellurium (W—Sb—Te), molybdenum-antimony-tellurium (Mo—Sb—Te) and/or chrome-antimony-tellurium (Cr—Sb—Te). The element in Group VIA-antimony-selenium may include tungsten-antimony-selenium (W—Sb—Se), molybdenum-antimony-selenium (Mo—Sb—Se) and/or chrome-antimony-selenium (Cr—Sb—Se).

In further embodiments, the programming layer pattern is $Ge_2Sb_2Te_5$ and the adiabatic layer pattern is GeTe. The programming layer pattern may be $Ge_2Sb_2Te_5$ and the adiabatic layer pattern may be GeTe.

In yet other embodiments of the present invention, the adiabatic layer pattern is a structure that includes at least two different kinds of material layers that are sequentially stacked. The adiabatic layer pattern may include a first layer including a first chalcogenide that has a melting point higher than that of the first phase-changeable material, and a second layer stacked on the first layer and including a second chalcogenide that has a thermal conductivity lower than that of the first phase-changeable material. The first and second layers may be alternately and repeatedly stacked. The first phase-changeable material may be $Ge_2Sb_2Te_5$, the first layer may be GeTe, and the second layer may be $Sb_2Te_3$. The adiabatic layer pattern may also be on a side face of the programming layer pattern to cover the programming layer pattern.

In some embodiments of the present invention, the first phase-changeable material of the programming layer pattern is a material proximate the lower electrode formed from heating a lower portion of the adiabatic layer pattern that is different from the first and second chalcogenide of the adiabatic layer pattern. The programming layer pattern is covered on top and side surfaces thereof by the adiabatic layer pattern.

In further embodiments of the present invention, methods of manufacturing a phase-changeable memory device include forming a lower electrode electrically connected to an impurity region of a transistor on the substrate. A programming layer including a first phase-changeable material is formed on the lower electrode. An adiabatic layer including a material having a lower thermal conductivity than the first phase-changeable material is formed on the programming layer pattern. A conductive layer is formed on the adiabatic layer. The conductive layer, the adiabatic layer and the programming layer are partially etched to form an upper electrode, an adiabatic layer pattern and a programming layer pattern.

In other embodiments, the adiabatic layer is a conductive material and the method includes forming the transistor including a gate structure and first and second impurity regions on the substrate and forming a wiring line electrically connected to the first impurity region on the substrate. Forming the lower electrode includes forming the lower electrode electrically connected to the second impurity region on the substrate. The adiabatic layer may be a second phase-changeable material having a melting point higher than that of the first phase-changeable material. The second phase-changeable material may have a melting point higher than that of the first phase-changeable material by no less than about 50° C. The second phase-changeable material may be chacogenide.

In yet other embodiments of the present invention, the programming layer and the adiabatic layer are formed in-situ in a same chamber. The first phase-changeable material may be selected from the group consisting of an element in Group VA-antimony-tellurium that includes germanium-antimony-tellurium (Ge—Sb—Te), arsenic-antimony-tellurium (As—Sb—Te), tin-antimony-tellurium (Sn—Sb—Te), silicon-germanium-antimony-tellurium (Si—Ge—Sb—Te), tin-indium-antimony-tellurium (Sn—In—Sb—Te), nitrogen-germanium-antimony-tellurium (N—Ge—Sb—Te), arsenic-germanium-antimony-tellurium (As—Ge—Sb—Te), tantalum-antimony-tellurium (Ta—Sb—Te), niobium-antimony-tellurium (Nb—Sb—Te) and/or vanadium-antimony-tellurium (V—Sb—Te), an element in Group VA-antimony-selenium that includes tantalum-antimony-selenium (Ta—Sb—Se) niobium-antimony-selenium (Nb—Sb—Se) and/or vanadium-antimony-selenium (V—Sb—Se), an element in Group VIA-antimony-tellurium that includes tungsten-antimony-tellurium (W—Sb—Te), molybdenum-antimony-tellurium (Mo—Sb—Te) and/or chrome-antimony-tellurium (Cr—Sb—Te), and an element in Group VIA-antimony-selenium that includes tungsten-antimony-selenium (W—Sb—Se), molybdenum-antimony-selenium (Mo—Sb—Se) and/or chrome-antimony-selenium (Cr—Sb—Se). The programming layer may be $Ge_2Sb_2Te_5$ and the adiabatic layer may be GeTe.

In further embodiments of the present invention, forming the adiabatic layer includes forming a first layer including a first chalcogenide that has a melting point higher than that of the first phase-changeable material and forming a second layer on the first layer, the second layer including a second chalcogenide that has a thermal conductivity lower than that of the first phase-changeable material. The first and second layers may be alternately and repeatedly stacked. The first phase-changeable material may be $Ge_2Sb_2Te_5$, the first layer may be GeTe, and the second layer may be $Sb_2Te_3$.

In other embodiments of the present invention, methods of manufacturing a phase-changeable memory device include forming a transistor including a gate structure and first and second impurity regions on a substrate. A wiring line is formed electrically connected to the first impurity region on the substrate. A lower electrode is formed electrically connected to the second impurity region on the substrate. A preliminary adiabatic layer structure is formed that includes a first adiabatic layer including a first phase-changeable material and a second adiabatic layer including a different second phase-changeable material. The first and second adiabatic layers are alternately and repeatedly stacked. A conductive layer is formed on the preliminary adiabatic layer structure.

The conductive layer and the first and second adiabatic layers are partially etched to form an adiabatic layer structure on the lower electrode. A lower portion of the adiabatic layer structure that makes contact with the lower electrode is heated to form a programming layer pattern including a different third phase-changeable material formed from heating of a material in the lower portion of the adiabatic layer structure and an upper electrode is formed on the adiabatic layer structure.

In some embodiments, the first phase-changeable material is GeTe and the second phase-changeable material is $SB_2Te_3$. Heating the lower portion of the preliminary adiabatic layer structure may include applying a current to the lower portion of the preliminary adiabatic layer structure through the lower electrode.

BRIEF DESCRIPTION OF THE DRAWINGS

The above and other features and advantages of the invention will become readily apparent by reference to the following detailed description when considered in conjunction with the accompanying drawings wherein.

DESCRIPTION OF THE EMBODIMENTS

Figure 1:
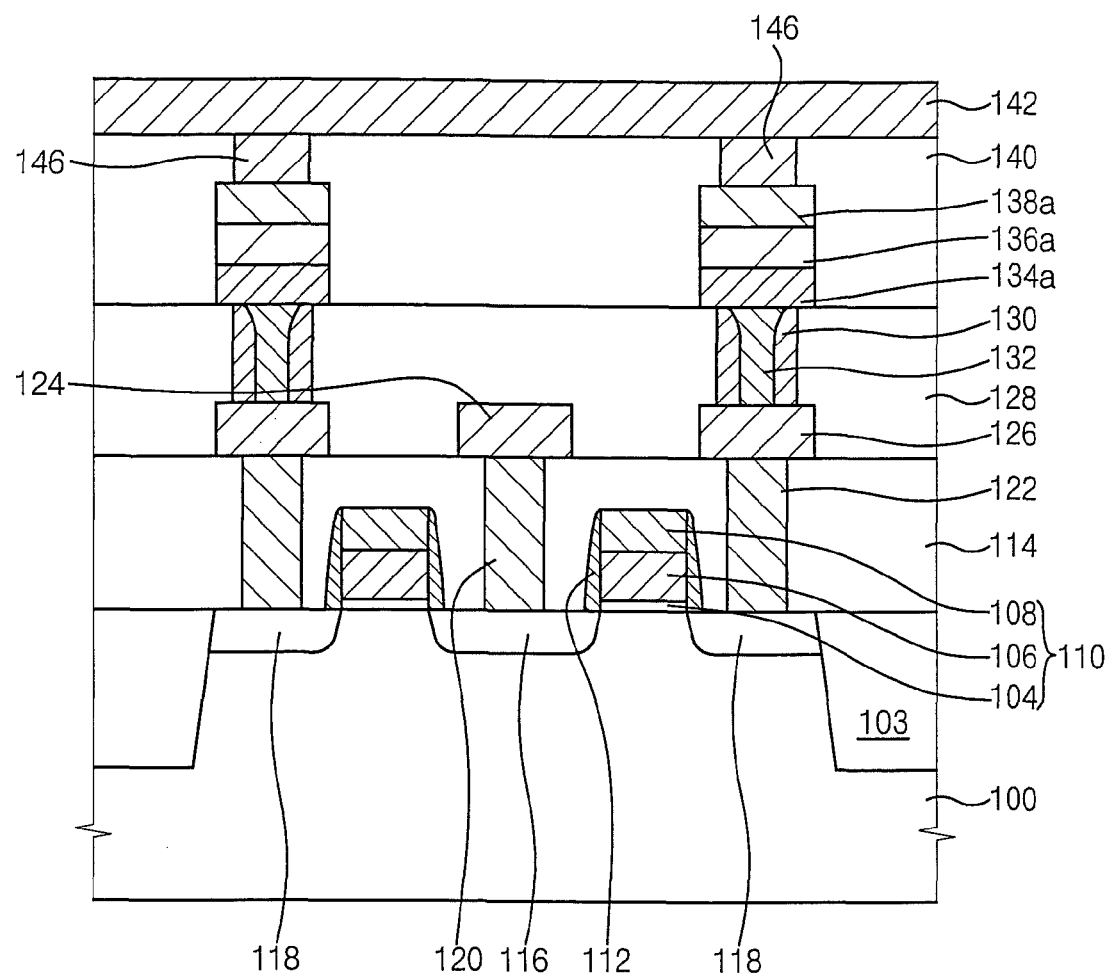
FIG. 1 is a cross sectional view illustrating a phase-changeable memory device according to some embodiments of the present invention.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross sectional view illustrating a phase-changeable memory device according to some embodiments of the present invention. Referring to the embodiments of FIG. 1, an isolation layer 103 is formed in a semiconductor substrate 100 to define an active region and a field region of the semiconductor substrate 100. The isolation layer 103 may be formed by a shallow trench isolation (STI) process.

A transistor is formed on the active region of the semiconductor substrate 100. The transistor includes a gate structure 110, and source/drain regions 116 and 118 formed in a surface portion of the semiconductor substrate 100 at both sides of the gate structure 110. The gate structure 110 includes a gate insulation layer 104, a gate electrode 106 and a hard mask pattern 108. A spacer 112 is formed on a sidewall of the gate structure 110. The source region 116 may be electrically connected to a lower wiring line and the drain region 118 may be electrically connected to a programming layer pattern including a phase-changeable material.

A first interlayer insulating layer 114 is formed on the semiconductor substrate 100 and the transistor. The first interlayer insulating layer 114 is shown as covering the transistor. First and second contact pads 120 and 122 are illustrated formed in the first interlayer insulating layer 114. The first contact pad 120 makes contact with the source region 116 and the second contact pad 122 makes contact with the drain region 118.

A lower wiring line 124 including a conductive material is formed on the first contact pad 120. Examples of a material for the lower wiring line 124 may include doped polysilicon, tungsten (W), aluminum (Al), tantalum (Ta), titanium (Ti), copper (Cu) and/or the like. These can be used alone or in a combination thereof. In some embodiments, the lower wiring line 124 includes a material having a low resistance, such as copper or tungsten. An isolated conductive pattern 126 is shown formed on the second contact pad 122.

A second interlayer insulating layer 128 is shown formed on the first interlayer insulating layer 114, the lower wiring line 124 and the conductive pattern 126. A first opening is formed through the second interlayer insulating layer 128 to expose the conductive pattern 126. A spacer 130 that narrows an opened width of the first opening is shown formed on side faces of the first opening. The first opening having the spacer 130 is filled with a lower electrode 132 so that the lower electrode 132 makes contact with the conductive pattern 126. Examples of a material for the lower electrode 132 may include doped polysilicon, tungsten (W), aluminum (Al), tantalum (Ta), titanium (Ti), copper (Cu) and/or the like. These can be used alone or in a combination thereof. In some embodiments, the lower electrode 132 includes a material having a low resistance, such as copper or tungsten.

A programming layer pattern 134a including a first phase-changeable material is formed on the lower electrode 132. The first phase-changeable material may include an element or elements in Group VI, such as chalcogenide except for oxygen. The phase-changeable material may include an element or elements in Group VA-antimony-tellurium, such as germanium-antimony-tellurium (Ge—Sb—Te), arsenic-antimony-tellurium (As—Sb—Te), tin-antimony-tellurium (Sn—Sb—Te), tin-indium-antimony-tellurium (Sn—In—Sb—Te), arsenic-germanium-antimony-tellurium (As—Ge—Sb—Te), silicon-germanium-antimony-tellurium (Si—Ge—Sb—Te), tin-germanium-antimony-tellurium (Sn—Ge—Sb—Te), nitrogen-germanium-antimony-tellurium (N—Ge—Sb—Te), tantalum-antimony-tellurium (Ta—Sb—Te), niobium-antimony-tellurium (Nb—Sb—Te), vanadium-antimony-tellurium (V—Sb—Te) or the like, and/or an element or elements in Group VA-antimony-selenium, such as tantalum-antimony-selenium (Ta—Sb—Se), niobium-antimony-selenium (Nb—Sb—Se), vanadium-antimony-selenium (V—Sb—Se) or the like. Further, the phase-changeable material may include an element or elements in Group VIA-antimony-tellurium, such as tungsten-antimony-tellurium (W—Sb—Te), molybdenum-antimony-tellurium (Mo—Sb—Te), chrome-antimony-tellurium (Cr—Sb—Te) or the like, or an element or elements in Group VIA-antimony-selenium, such as tungsten-antimony-selenium (W—Sb—Se), molybdenum-antimony-selenium (Mo—Sb—Se), chrome-antimony-selenium (Cr—Sb—Se) or the like. In some embodiments, the programming layer pattern 134a includes $Ge_2Sb_2Te_5$.

Also shown in the embodiments of FIG. 1 is an adiabatic layer pattern 136a that is formed on the programming layer pattern 134a. The adiabatic layer pattern 136a may have a high electric conductivity. The adiabatic layer pattern 136a may also have an adiabatic characteristic (i.e. resistance to heat exchange therethrough) better than that of the programming layer pattern 134a. For example, the adiabatic layer pattern 136a may include chalcogenide having a melting point higher than that of the first phase-changeable material.

In some embodiments, the adiabatic layer pattern 136a has a melting point higher than that of the first phase-changeable material by at least about 50° C.

Chalcogenide generally has characteristics that differ significantly between its crystalline structure and amorphous structure states. Generally, when chalcogenide has a crystalline structure, the crystalline chalcogenide has a high electric conductivity and a low thermal conductivity. On the contrary, when chalcogenide has an amorphous structure, the amorphous chalcogenide has a higher resistance and, thus, a lower electric conductivity, and a higher thermal conductivity. Maintaining the chalcogenide used for the adiabatic layer pattern 136a in the crystalline structure may provide a lower thermal conductivity for that layer.

Although the programming layer pattern 134a is changed into the amorphous structure and vice versa while operating the phase-changeable memory device, the adiabatic layer pattern 136a in some embodiments is continuously maintained in the crystalline structure. To maintain the crystalline structure, the adiabatic layer pattern 136a may include a chalcogenide having a melting point higher that that of the first phase-changeable material.

In some embodiments, the programming layer pattern 134a includes $Ge_2Sb_2Te_5$ having a melting point of about 615° C. and the adiabatic layer pattern 136a includes GeTe having a melting point of about 700° C. When the phase-changeable memory device including the programming layer pattern 134a and the adiabatic layer pattern 136a is operated, a temperature for changing phases of the programming layer pattern 134a may be no more than about 700° C.

The programming layer pattern 134a may have a thickness with a phase of a portion making contact with the lower electrode 132 that is changeable. As the adiabatic layer pattern 136a is formed on the programming layer pattern 134a, it may not be necessary to increase a thickness of the programming layer pattern 134a for suppressing a heat loss. Thus, the programming layer pattern 134a may have a relatively thin thickness compared to that of a conventional structure without the adiabatic layer pattern 136a so that a region in which data is programmed may have a relatively small area, which may reduce a current required for programming the data. When the programming layer pattern 134a includes $Ge_2Sb_2Te_5$, the programming layer pattern 134a may have a thickness of about 400 Å to about 1,000 Å. In some embodiments, the programming layer pattern 134a includes $Ge_2Sb_2Te_5$ and has a thickness of about 400 Å to about 500 Å.

Although silicon oxide or silicon nitride may have a suitable adiabatic characteristic, silicon oxide or silicon nitride does not generally have a suitable electric conductivity so that silicon oxide or silicon nitride may not be suitable for use as the adiabatic layer pattern 136a in some embodiments. Although a metal generally has a high electric conductivity, the metal typically has a high thermal conductivity and a poor adiabatic characteristic so that a metal may not be suitable for the adiabatic layer pattern 136a in some embodiments.

As shown in the embodiments of FIG. 1, an upper electrode 138a is formed on the adiabatic layer pattern 136a. A third interlayer insulating layer 140 is formed on the second interlayer insulating layer 128 to cover the programming layer pattern 134a, the adiabatic layer pattern 136a and the upper electrode 138a. A third contact pad 146 is formed in the third interlayer insulating layer 140. The third contact pad 146 makes contact with the upper electrode 138a. An upper wiring line 142 is formed on the third interlayer insulating layer 140. The upper wiring line 142 makes contact with the third contact pad 146.

For a phase-changeable memory device according to some embodiments of the present invention, as the adiabatic layer pattern is formed on the programming layer pattern, the loss of the heat transferred to the upper electrode in programming the data may be suppressed. The programming layer pattern may have a thin thickness and the phase-changeable memory device may have a low set resistance and a low current required for programming the data.

Figure 2:
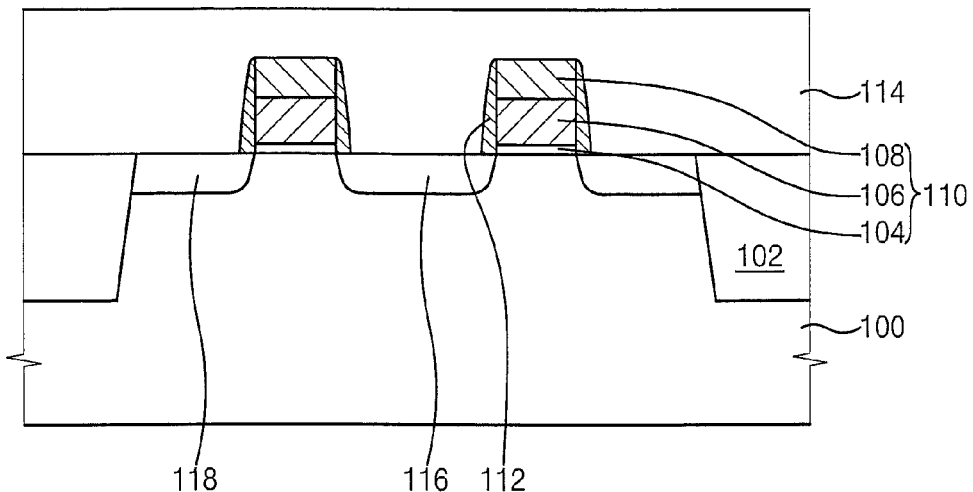
FIGS. 2 to 8 are cross sectional views illustrating methods of manufacturing the phase-changeable memory device in FIG. 1 according to some embodiments of the present invention.

FIGS. 2 to 8 are cross sectional views illustrating methods of manufacturing the phase-changeable memory device in FIG. 1 according to some embodiments of the present invention. Referring to FIG. 2, the isolation layer 103 may be formed in the semiconductor substrate 100 by an STI process or a local oxidation of silicon (LOCOS) process to define the active region and the field region of the semiconductor substrate 100. A gate structure 110, which may include the gate insulating layer 104, the gate electrode 106 and the hard mask pattern 108, is formed on the active region of the semiconductor substrate 100. The gate spacer 112 may be formed on a sidewall of the gate structure 110. Impurities may be implanted into portions of the semiconductor substrate 100 to form the source/drain regions 116 and 118.

The first interlayer insulating layer 114 is formed on the semiconductor substrate 100 so that the first interlayer insulating layer 114 covers the transistor. Examples of a material that may be used for the first interlayer insulating layer 114 include TEOS, USG, SOG, HDP-CVD and/or the like. These can be used alone or in a combination thereof. The first interlayer insulating layer 114 may be planarized by a chemical mechanical polishing (CMP) process.

Figure 3:
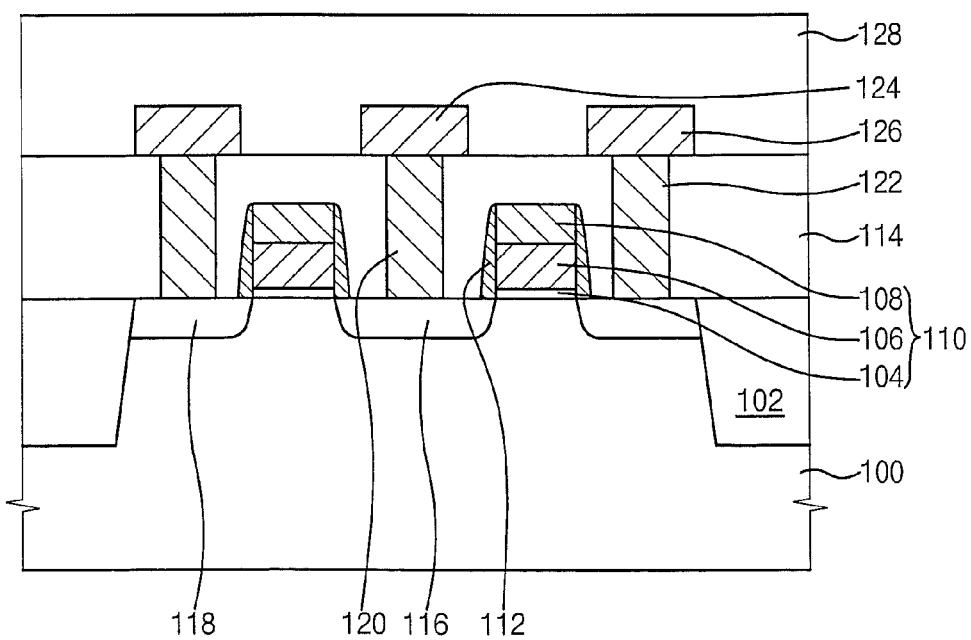

Referring now to FIG. 3, the first interlayer insulating layer 114 is partially etched to form first and second contact holes exposing the source/drain regions 116 and 118. The first and second contact holes are filled with a first conductive layer. The first conductive layer is planarized by a CMP process and/or an etch-back process to form the first contact pad 120 in the first contact hole and the second contact pad 122 in the second contact hole. The first conductive layer may be, for example, doped polysilicon with impurities and/or a metal such as copper, tantalum, tungsten, aluminum or the like. These can be used alone or in a combination thereof.

A second conductive layer is formed on the first interlayer insulating layer 114 including the first and second contact pads 120 and 122. The second conductive layer is patterned to form the lower wiring line 124 on the first contact pad 120 and the isolated conductive pattern 126 on the second contact pad 122.

The lower wiring line 124 and the conductive pattern 126 may be formed by a damascene process. The damascene process may be suitable for forming the lower wiring line 124 and the conductive pattern 126 using copper. In particular, an additional interlayer insulating layer may be formed on the first interlayer insulating layer 114. Trenches may be formed through the additional interlayer insulating layer and a copper layer may be formed on the additional interlayer insulating layer to fill up the trenches. The copper layer may be planarized to form the lower wiring line 124 and the conductive pattern 126. The first contact pad 120, the second contact pad 122, the lower wiring line 124 and the conductive pattern 126 may be formed by a dual damascene process.

The second interlayer insulating layer 128 is formed on the first interlayer insulating layer 114 to cover the conductive pattern 126 and the lower wiring line 124. Examples of an oxide material that may be used for the second interlayer insulating layer 128 include TEOS, USG, SOG, HDP-CVD and/or the like. These can be used alone or in a combination thereof.

Figure 4:
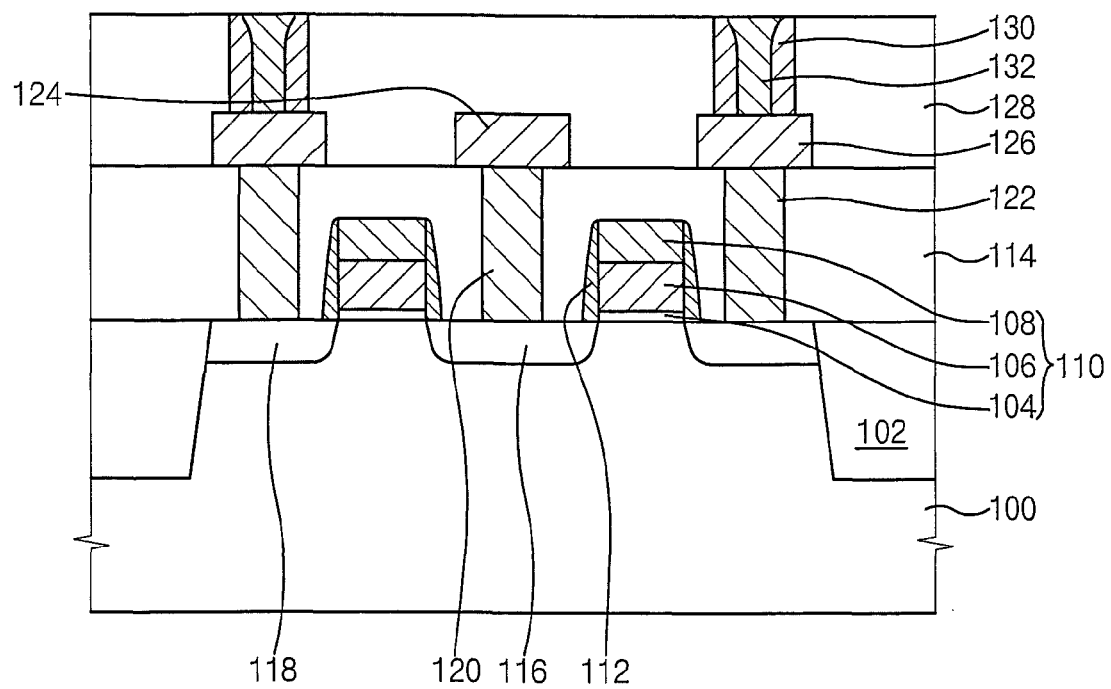

Referring now to FIG. 4, the second interlayer insulating layer 128 is partially etched to form the first opening exposing the conductive pattern 126. A nitride layer is formed on the second interlayer insulating layer 128 and a sidewall of the first opening. The nitride layer is anisotropically etched to form the spacer 130 on the sidewall of the first opening. The spacer 130 may include silicon nitride, silicon oxynitride and/or the like in some embodiments. Also, the spacer 130 may include a dual spacer having a silicon oxynitride layer and a silicon nitride layer sequentially stacked.

The spacer 130 may be used to reduce an opened size of the first opening. The opened size may be smaller than the limited resolution otherwise available in a photo process. Thus, the lower electrode 132 in the first opening may have a reduced size in accordance with the opened size of the first opening so that the region in which the data is programmed by changing of a phase in a region of the programming layer pattern 134a may have a relatively small area. As a result, a current required for changing the phase may be reduced.

A third conductive layer is formed on the second interlayer insulating layer 128 to fill up the first opening. Examples of materials that may be used for the third conductive layer include doped polysilicon metal, metal nitride and/or the like. These can be used alone or in a combination thereof. In some embodiments, the third conductive layer is formed using titanium nitride. The third conductive layer may be planarized by a CMP process and/or an etch-back process until the upper surface of the second interlayer insulating layer 128 is exposed, to thereby form the lower electrode 132 in the first opening.

Figure 5:
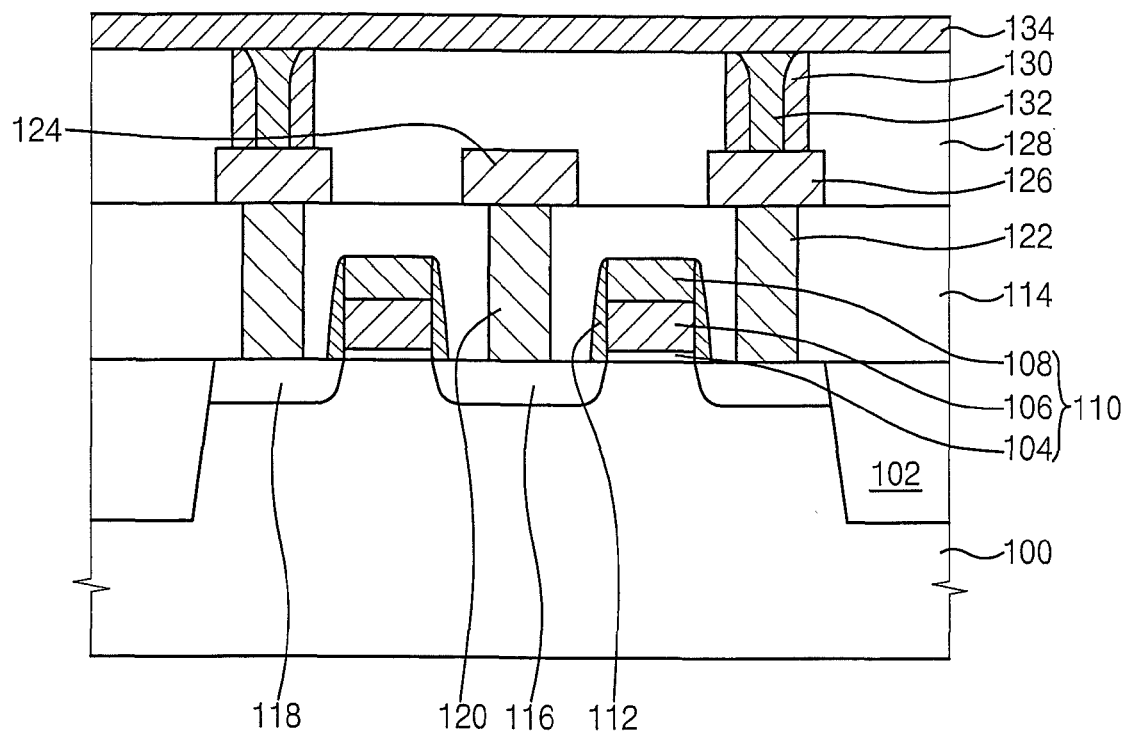

Referring next to FIG. 5, the first phase-changeable material is deposited on the second interlayer insulating layer 128 having the lower electrode 132 to form a programming layer 134. The first phase-changeable material may include an element(s) in Group VI, such as chalcogenide except for oxygen. The phase-changeable material may include an element(s) in Group VA-antimony-tellurium, such as germanium-antimony-tellurium (Ge—Sb—Te), arsenic-antimony-tellurium (As—Sb—Te), tin-antimony-tellurium (Sn—Sb—Te), tin-indium-antimony-tellurium (Sn—In—Sb—Te), arsenic-germanium-antimony-tellurium (As—Ge—Sb—Te), silicon-germanium-antimony-tellurium (Si—Ge—Sb—Te), tin-germanium-antimony-tellurium (Sn—Ge—Sb—Te), nitrogen-germanium-antimony-tellurium (N—Ge—Sb—Te), tantalum-antimony-tellurium (Ta—Sb—Te), niobium-antimony-tellurium (Nb—Sb—Te), vanadium-antimony-tellurium (V—Sb—Te) and/or the like, or an element(s) in Group VA-antimony-selenium, such as tantalum-antimony-selenium (Ta—Sb—Se) niobium-antimony-selenium (Nb—Sb—Se), vanadium-antimony-selenium (V—Sb—Se) and/or the like. Further, the phase-changeable material may include an element(s) in Group VIA-antimony-tellurium, such as tungsten-antimony-tellurium (W—Sb—Te), molybdenum-antimony-tellurium (Mo—Sb—Te), chrome-antimony-tellurium (Cr—Sb—Te) and/or the like, or an element(s) in Group VIA-antimony-selenium, such as tungsten-antimony-selenium (W—Sb—Se), molybdenum-antimony-selenium (Mo—Sb—Se), chrome-antimony-selenium (Cr—Sb—Se) and/or the like. The programming layer may be formed using at least one of the chalcogenides as above. In some embodiments, the programming layer 134 is formed by depositing Ge—Sb—Te ($Ge_2Sb_2Te_5$).

In some embodiments, the programming layer 134 has a thickness slightly thicker than that of the region to be programmed. In some embodiments, the programming layer 134 has a thickness of about 400 Å to about 1,000 Å. In particularly embodiments, the programming layer has a thickness of about 400 Å to about 500 Å.

Figure 6:
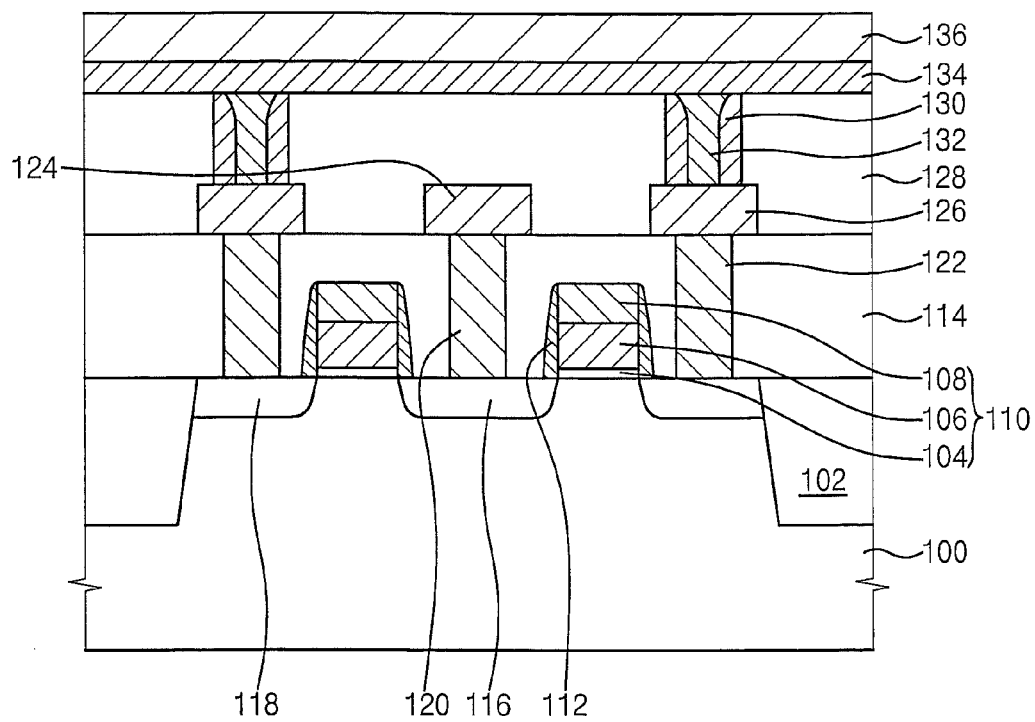

Referring now to FIG. 6, an adiabatic layer 136 is formed on the programming layer 134. The adiabatic layer 136 in some embodiments has a high electric conductivity. The adiabatic layer 136 in some embodiments has an adiabatic characteristic better than that of the programming layer 134. In some embodiments, a material of the adiabatic layer 136 includes chalcogenide having a melting point higher than that of the first phase-changeable material. The melting point of the adiabatic layer 135 may be higher than that of the first phase-changeable material by no less than about 50° C. In some embodiments, the programming layer 134 includes $Ge_2Sb_2Te_5$ and the adiabatic layer 136 includes GeTe. The programming layer 134 and the adiabatic layer 136 may be formed in-situ in a substantially same chamber or by a sputtering process.

Figure 7:
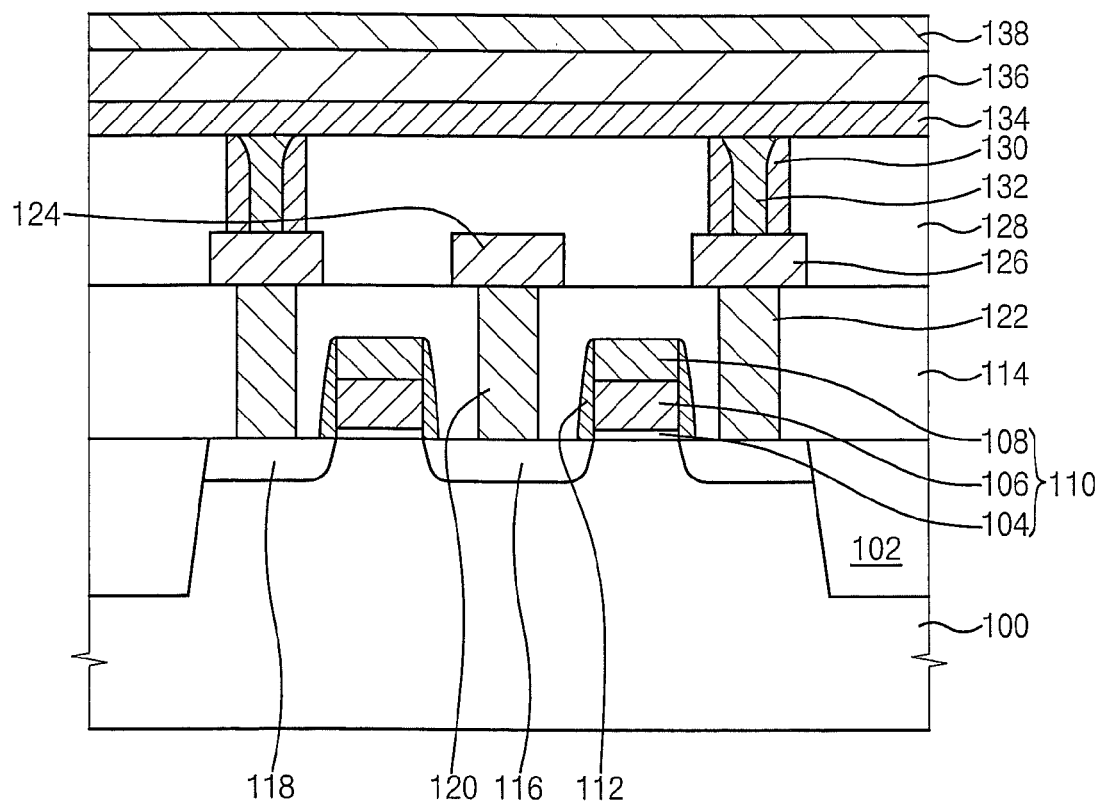

As shown in FIG. 7, a fourth conductive layer 138 is formed on the adiabatic layer 136. Examples of materials that may be used for the fourth conductive layer 138 include nitrogen-containing metal, metal, metal silicide and/or the like. These can be used alone or in a combination thereof. Examples of nitrogen-containing metals that may be used include titanium nitride, tantalum nitride, molybdenum nitride, niobium-boron nitride, zirconium-silicon nitride, tungsten-silicon nitride, tungsten-boron nitride, zirconium-aluminum nitride, molybdenum-silicon nitride, molybdenum-aluminum nitride, tantalum-silicon nitride, tantalum-aluminum nitride, titanium oxynitride, titanium-aluminum oxynitride, tungsten oxynitride, tantalum oxynitride and/or the like. These can be used alone or in a combination thereof. Examples of metals that may be used include titanium, tungsten, molybdenum, tantalum and/or the like. These can be used alone or in a combination thereof. Examples of metal silicides that may be used include titanium silicide, tantalum silicide and/or the like. These can be used alone or in a combination thereof.

Figure 8:
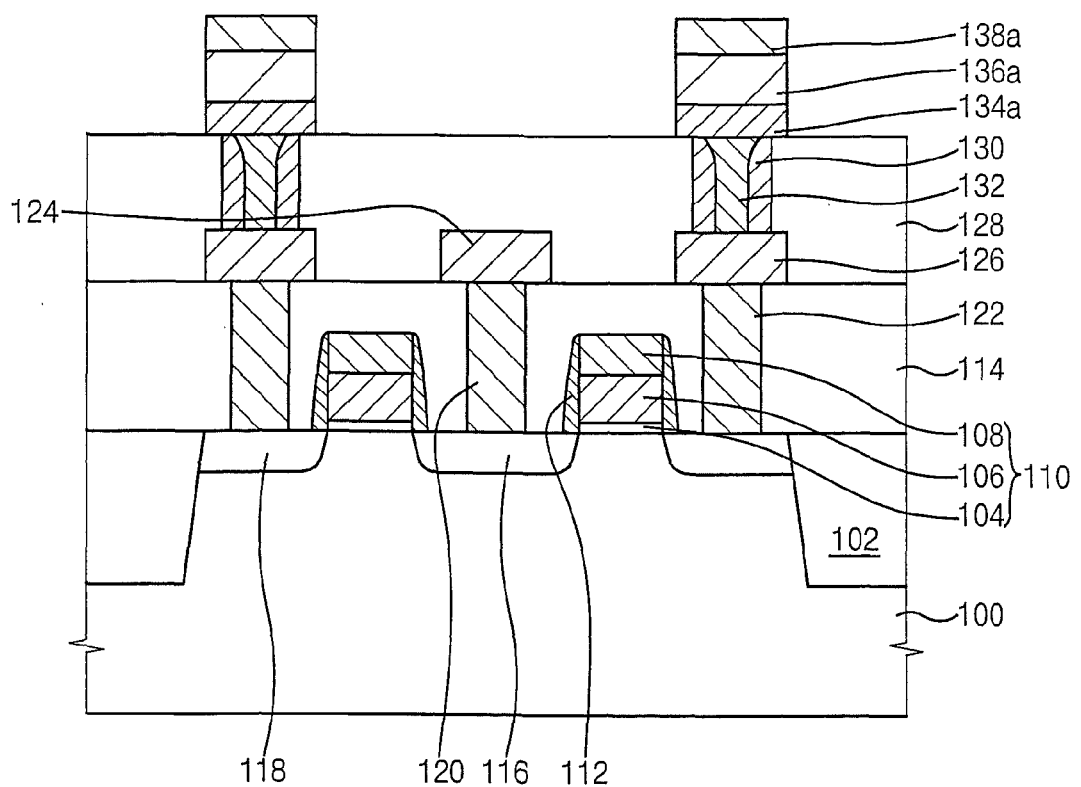

Referring now to FIG. 8, the fourth conductive layer 138, the adiabatic layer 136 and the programming layer 134 are patterned to form the programming layer pattern 134a, the adiabatic layer pattern 136a and the upper electrode 138a.

Referring next back to FIG. 1, the third interlayer insulating layer 140 is formed on the second interlayer insulating layer 140 to cover the upper electrode 138a. The third interlayer insulating layer 140 is partially etched to form a third contact hole exposing the upper electrode 138a. The third contact hole is filled with a conductive layer to form the third contact pad 146. The upper wiring line 142 is formed on the third interlayer insulating layer 140 and the third contact pad 146.

Figure 9:
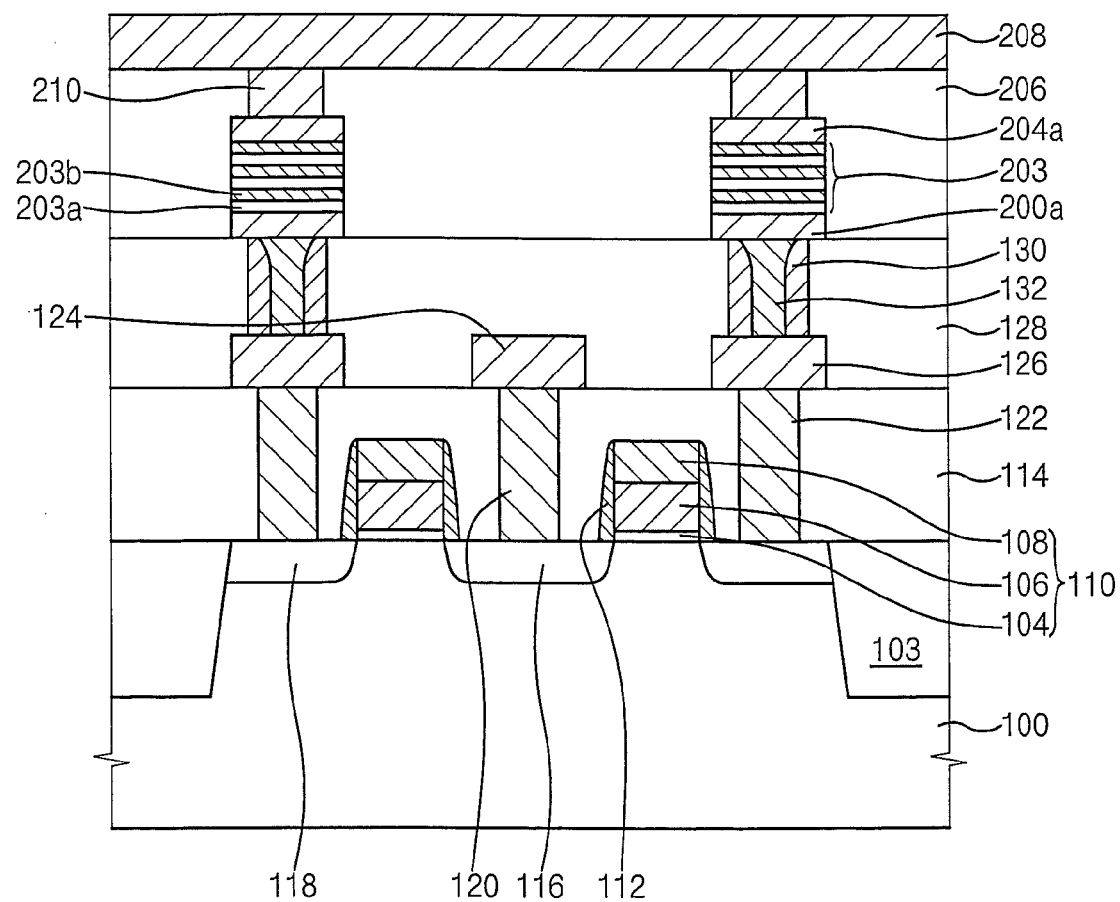
FIG. 9 is a cross sectional view illustrating a phase-changeable memory device according to further embodiments of the present invention.

Further embodiments of the present invention will now be described with reference to FIGS. 9-12. FIG. 9 is a cross sectional view illustrating a phase-changeable memory device in accordance with some embodiments of the present invention. The phase-changeable memory device of the embodiments of FIG. 9 includes numbered items substantially corresponding to those of the like numbered items of the phase-changeable memory device described with reference to FIGS. 1-8. As will be described below, the adiabatic layer pattern of FIG. 9 differs from that of FIG. 1.

Referring now to the embodiments of FIG. 9, an isolation layer 103 is formed in a semiconductor substrate 100 to define an active region of the semiconductor substrate 10. A first interlayer insulating layer 114 is formed on the semiconductor substrate 100 to cover a transistor. First and second contact pads 120 and 122 are formed in the first interlayer insulating layer 114. The first contact pad 120 makes contact with a source region 116 and the second contact pad 122 makes contact with a drain region 118.

A lower wiring line 124 including a conductive material is formed on the first contact pad 120. An isolated conductive pattern 126 is formed on the second contact pad 122.

A second interlayer insulating layer 128 is formed on the first interlayer insulating layer 114, the lower wiring line 124 and the conductive pattern 126. A lower electrode 132 is formed in second interlayer insulating layer. The lower electrode 132 makes contact with the conductive pattern 126.

A programming layer pattern 200a, including a first phase-changeable material, is formed on the lower electrode 132. The first phase-changeable material may include chalcogenide. The programming layer pattern 200a in some embodiments includes $Ge_2Sb_2Te_5$.

An adiabatic layer structure 203 is formed on the programming layer pattern 200a. The adiabatic layer structure 203 in some embodiments has a high electric conductivity. The adiabatic layer structure 203 in some embodiments has an adiabatic characteristic better than that of the programming layer pattern 200a. The adiabatic layer structure 203 in some embodiments includes a first adiabatic layer pattern 203a, including a first chalcogenide having a melting point higher than that of the first phase-changeable material, and a second adiabatic layer pattern 203b, including a second chalcogenide different from the first chalcogenide. The first and second adiabatic layer patterns 203a and 203b may be alternately stacked (where three stacked layers, each including a layer pattern 203a and a layer pattern 203b layered on each other are shown in FIG. 9).

Although the programming layer pattern 200a is changed into the amorphous structure and vice versa in operating the phase-changeable memory device, the adiabatic layer structure 203 in some embodiments is continuously maintained in the crystalline structure. To maintain the crystalline structure in some embodiments, the first adiabatic layer pattern 203a of the adiabatic layer structure 203 includes chalcogenide having a melting point high that that of the first phase-changeable material.

In some embodiments, the programming layer pattern 200a includes $Ge_2Sb_2Te_5$, the first adiabatic layer pattern 203a includes GeTe and the second adiabatic layer pattern 203b includes $Sb_2Te_3$. With the adiabatic layer structure 203 having alternately stacked adiabatic layer patterns having materials different from each other, the adiabatic layer structure 203 may have a relatively low thermal conductivity compared to that of the adiabatic layer pattern 136a described with reference to FIG. 1 and may provide even more adiabatic effect to limit heat loss from the programming layer pattern.

An upper electrode 204a is formed on the adiabatic layer structure 203. A third interlayer insulating layer 206 is formed on the second interlayer insulating layer 128 to cover the programming layer pattern 200a, the adiabatic layer structure 203 and the upper electrode 204a. A third contact pad 210 is formed in the third interlayer insulating layer 206. The third contact pad 210 makes contact with the upper electrode 204a. An upper wiring line 208 is formed on the third interlayer insulating layer 206. The upper wiring line 208 makes contact with the third contact pad 210.

For some embodiments of the present invention as illustrated in FIG. 9, as the adiabatic layer structure includes the alternately stacked first and second adiabatic layer patterns, the heat loss while transferring the heat to the upper electrode in programming the data may be suppressed.

Figure 10:
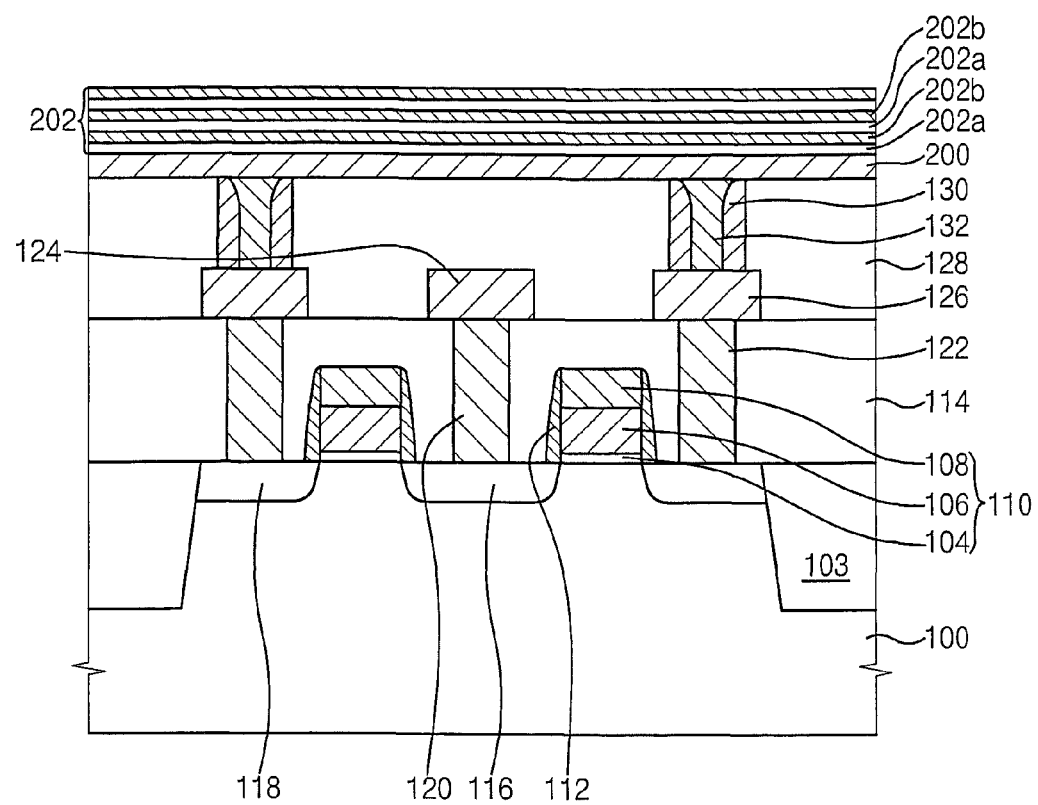
FIGS. 10 to 12 are cross sectional views illustrating methods of manufacturing the phase-changeable memory device in FIG. 9 according to some embodiments of the present invention.
Figure 11:
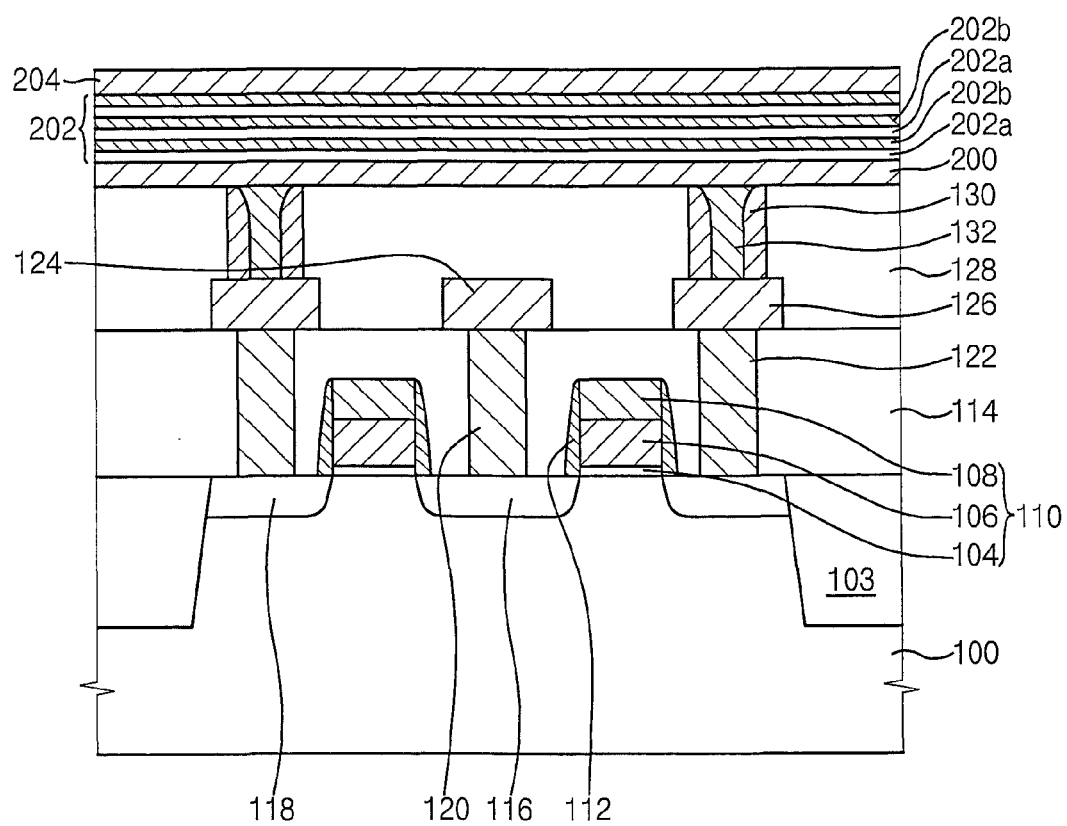
Figure 12:
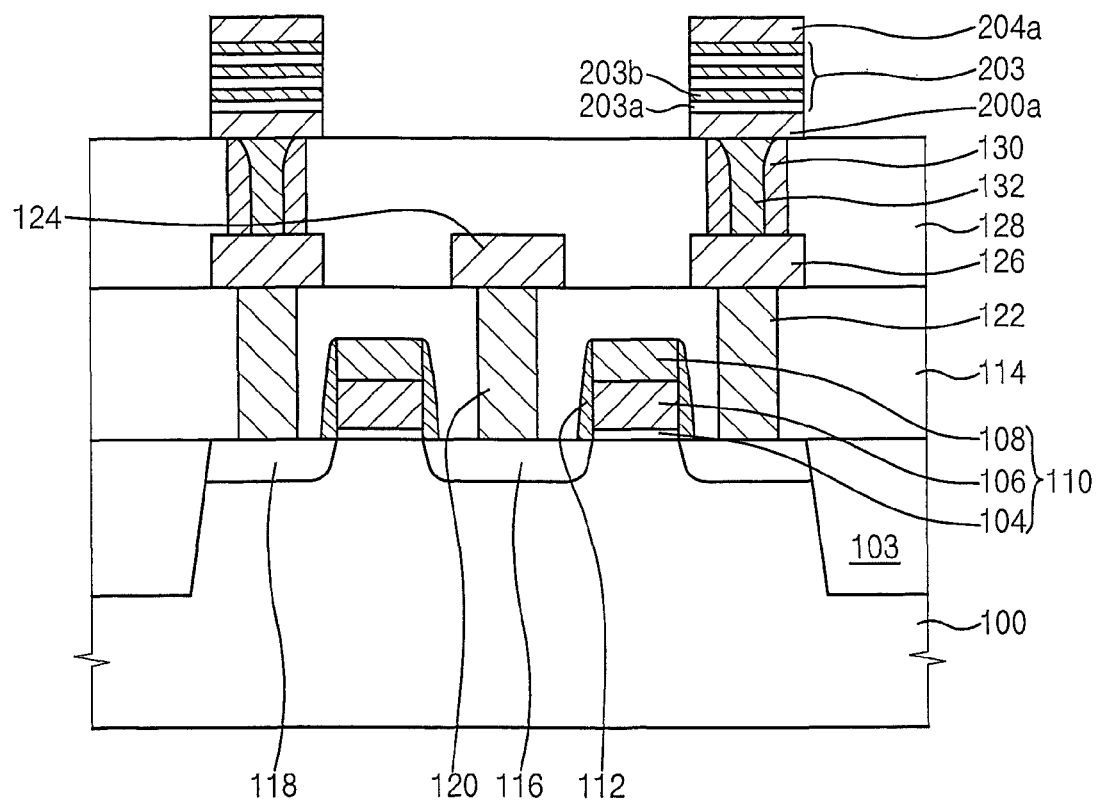

FIGS. 10 to 12 are cross sectional views illustrating methods of manufacturing the phase-changeable memory device in FIG. 9 according to some embodiments of the present invention. The processes before forming the programming layer pattern 200a may be substantially identical to those described with reference to FIGS. 2 to 5 above. As such, further discussion of such operations will not be repeated.

Referring now to FIG. 10, a programming layer 200 including the first phase-changeable material is formed on the lower electrode 132. The programming layer 200 in some embodiments includes $Ge_2Sb_2Te_5$. A first adiabatic layer 202a is formed on the programming layer 200. The first adiabatic layer 202a may have a high electric conductivity. The first adiabatic layer 202a may also have an adiabatic characteristic better than that of the programming layer 200. The first adiabatic layer 202a may include chalcogenide having a melting point higher than that of the first phase-changeable material. A second adiabatic layer 202b is formed on the first adiabatic layer 202a. The second adiabatic layer 202b may have a high electric conductivity and a good adiabatic characteristic. The second adiabatic layer 202b may include chalcogenide.

In some embodiments, the programming layer 200 includes $Ge_2Sb_2Te_5$, the first adiabatic layer 202a includes GeTe that has a higher melting point than $Ge_2Sb_2Te_5$ and the second adiabatic layer 202b includes $Sb_2Te_3$. As $Sb_2Te_3$ has a melting point of about 580° C. that is lower than that of $Ge_2Sb_2Te_5$, $Sb_2Te_3$ may not be appropriate for the first adiabatic layer 202a in some embodiments.

The first adiabatic layer 202a and the second adiabatic layer 202b may be alternately stacked to form a preliminary adiabatic layer structure 202, which structure may improve adiabatic effect.

Referring next to FIG. 11, a fourth conductive layer 204 is formed on the preliminary adiabatic layer structure 202. In some embodiments the fourth conductive layer 204 includes nitrogen-containing metal, metal, metal silicide, and/or the like. These can be used alone or in a combination thereof.

Referring to FIG. 12, the fourth conductive layer 204, the preliminary adiabatic layer structure 202 and the programming layer 200 are patterned to form the programming layer pattern 200a, the adiabatic layer structure 203 and the upper electrode 204a.

Referring now back to FIG. 9, the third interlayer insulating layer 206 is formed on the second interlayer insulating layer 128 to cover the upper electrode 204a. The third interlayer insulating layer 206 is partially etched to form a third contact hole exposing the upper electrode 204a. The third contact hole is filled with a conductive layer to form the third contact pad 210. The upper wiring line 208 is formed on the third interlayer insulating layer 206 and the third contact pad 210.

Figure 13:
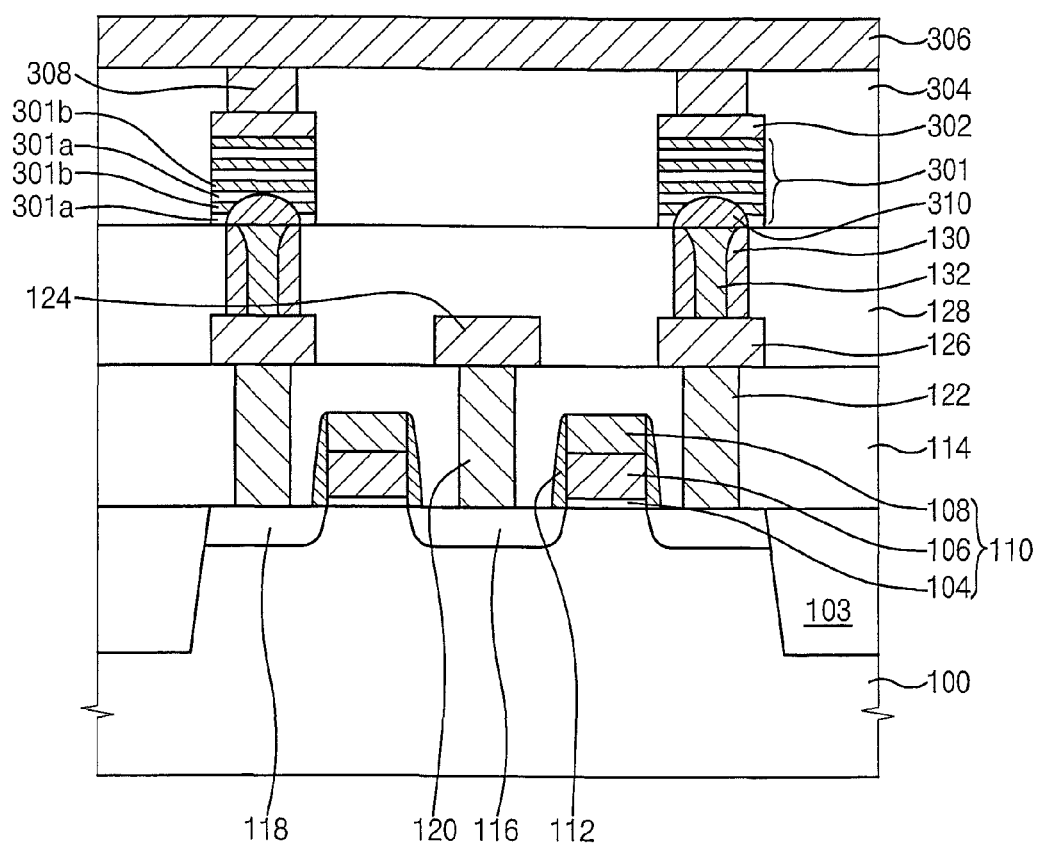
FIG. 13 is a cross sectional view illustrating a phase-changeable memory device according to other embodiments of the present invention.

Further embodiments of the present invention will now be described with reference to FIGS. 13-16. FIG. 13 is a cross sectional view illustrating a phase-changeable memory device in accordance with a second embodiment of the present invention. The phase-changeable memory device of the embodiments of FIG. 13 include various numbered items that are substantially identical to the same item numbered elements described previously. The embodiments of FIG. 13 generally differ in the programming layer pattern and the adiabatic layer pattern.

Referring now to FIG. 13, an isolation layer 103 is formed in a semiconductor substrate 100 to define an active region of the semiconductor substrate 100. A first interlayer insulating layer 114 is formed on the semiconductor substrate 100 to cover the transistor. First and second contact pads 120 and 122 are formed in the first interlayer insulating layer 114. The first contact pad 120 makes contact with a source region 116 and the second contact pad 122 makes contact with a drain region 118.

A lower wiring line 124 including a conductive material is formed on the first contact pad 120. An isolated conductive pattern 126 is formed on the second contact pad 122.

A second interlayer insulating layer 128 is formed on the first interlayer insulating layer 114, the lower wiring line 124 and the conductive pattern 126. A lower electrode 132 is formed in the second interlayer insulating layer 128. The lower electrode 132 makes contact with the conductive pattern 126.

A first adiabatic layer pattern 301a is formed on a portion of the second interlayer insulating layer 128 adjacent to the lower electrode 132. A second adiabatic layer pattern 301b is formed on the first adiabatic layer pattern 301a. The first and second adiabatic layer patterns 301a and 301b in some embodiments include chalcogenide. The first and second adiabatic layer patterns 301a and 301b may be alternatively stacked to form an adiabatic layer structure 301.

A programming layer pattern 310 covers the lower electrode 132. The programming layer pattern 310 includes a phase-changeable material that is formed by thermally reacting materials of the first and second adiabatic layer patterns 301a and 301b. Thus, the adiabatic layer structure 301 covers the programming layer pattern 310.

In some embodiments, the first adiabatic layer pattern 301a includes $Sb_2Te_3$ and the second adiabatic layer pattern 301b includes GeTe. In further embodiments, the first adiabatic layer pattern 301a includes GeTe, the second adiabatic layer pattern 301b includes $Sb_2Te_3$ and the programming layer pattern 310 includes $Ge_2Sb_2Te_5$.

In some embodiments, the programming layer pattern 310 has a reduced size so that a set resistance may be reduced. Further, as the adiabatic layer structure 301 covers the programming layer pattern 310, the adiabatic effect may be significantly improved.

An upper electrode 302 is formed on the adiabatic layer structure 301. A third interlayer insulating layer 304 is formed on the second interlayer insulating layer 128 to cover the adiabatic layer structure 301 and the upper electrode 302. A third contact pad 308 is formed in the third interlayer insulating layer 304. The third contact pad 308 makes contact with the upper electrode 302. An upper wiring line 306 is formed on the third interlayer insulating layer 304. The upper wiring line 306 makes contact with the third contact pad 308.

Figure 14:
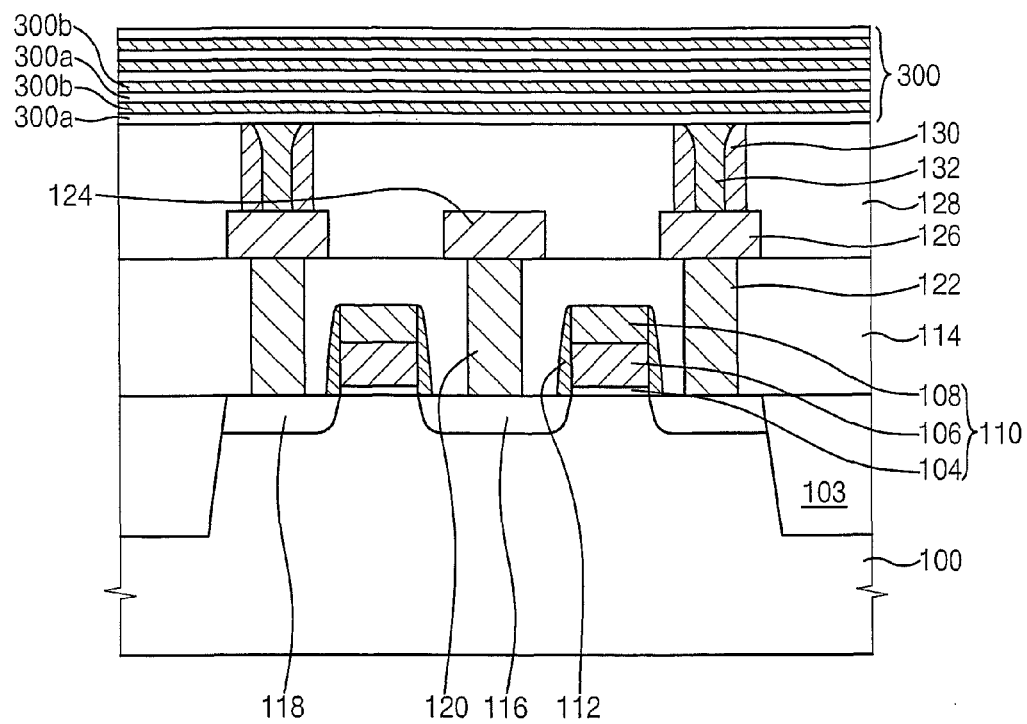
FIGS. 14 to 16 are cross sectional views illustrating methods of manufacturing the phase-changeable memory device in FIG. 13 according to some embodiments of the present invention.
Figure 15:
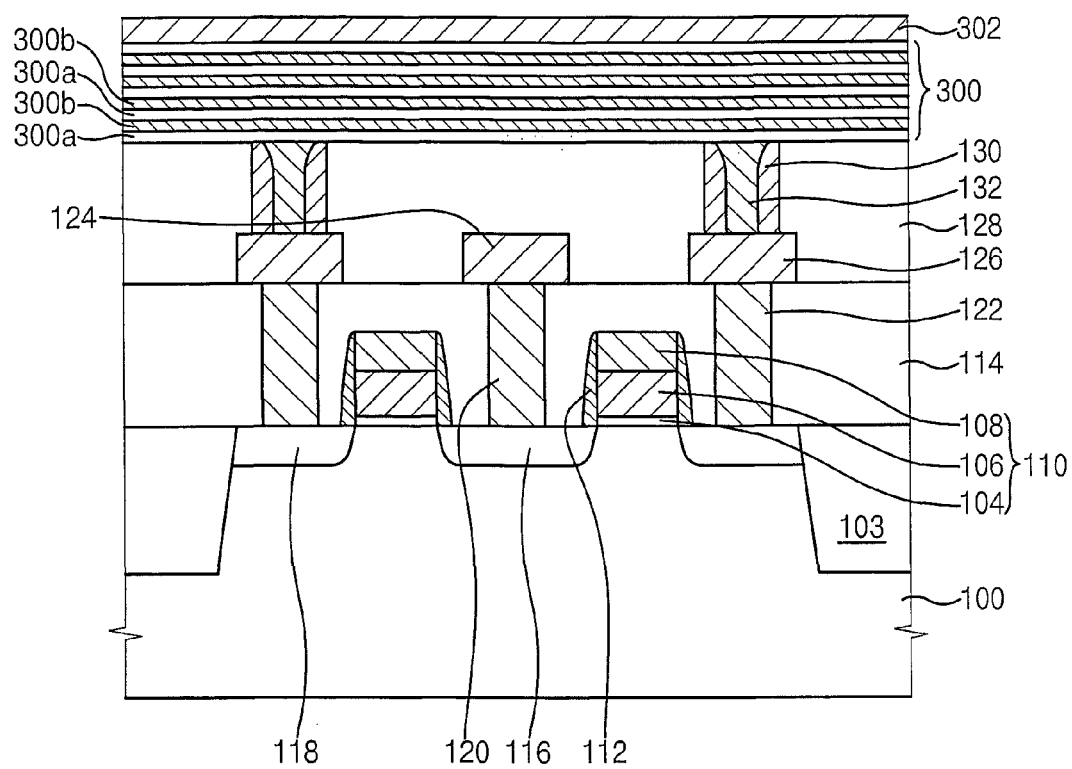
Figure 16:
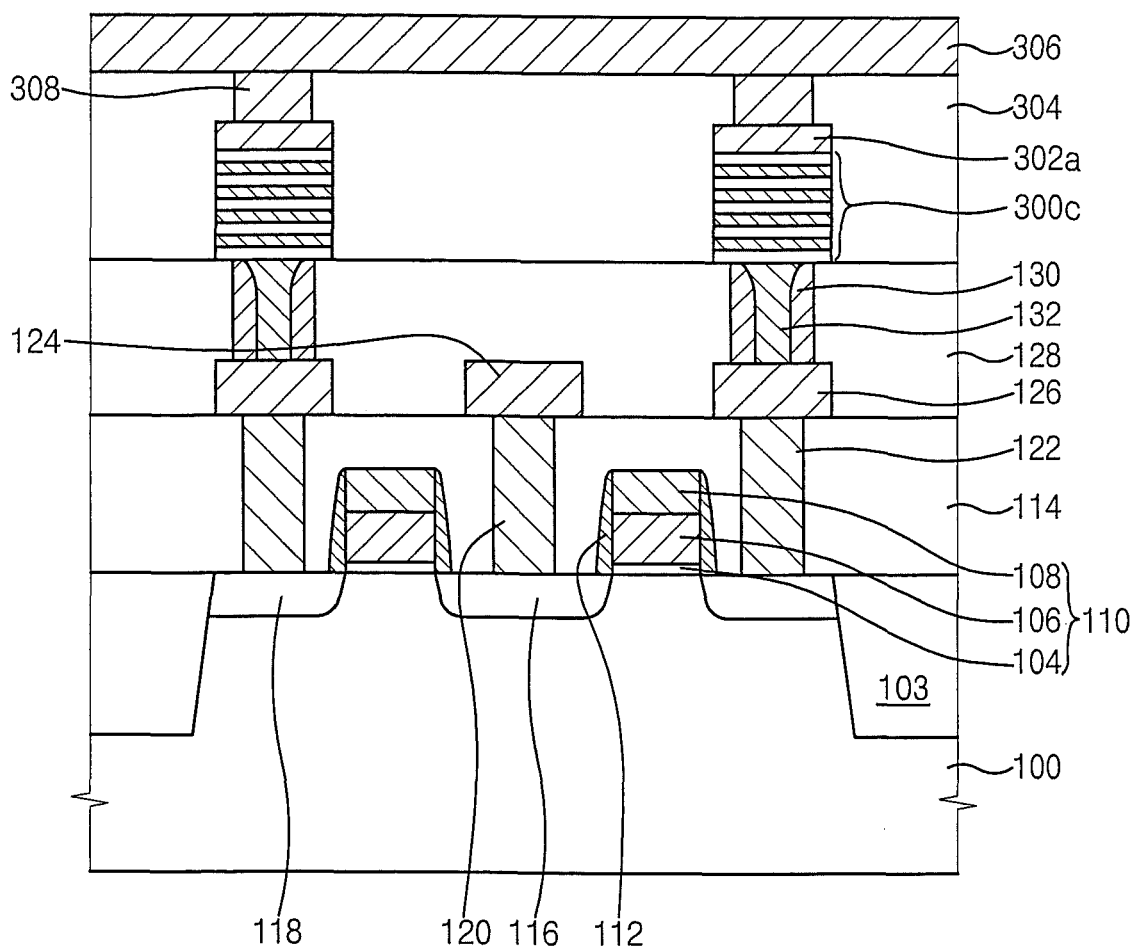

FIGS. 14 to 16 are cross sectional views illustrating methods of manufacturing the phase-changeable memory device in FIG. 13 according to some embodiments of the present invention. The processing operations up to forming a programming layer are substantially identical to those illustrated and described previously herein and will not be further described herein.

Referring to FIG. 14, a first phase-changeable material having a high electric conductivity and a good adiabatic characteristic is deposited on the lower electrode 132 to form a first adiabatic layer 300a. A second phase-changeable material having a high electric conductivity and a good adiabatic characteristic is deposited on the first adiabatic layer 300a to form a second adiabatic layer 300b. In some embodiments, the first and second adiabatic layers 300a and 300b include chalcogenides different from each other. For example, in some embodiments the first adiabatic layer 300a includes $Sb_2Te_3$ and the second adiabatic layer 300b includes GeTe.

The first adiabatic layer 300a and the second adiabatic layer 300b are shown as alternately stacked to form a first preliminary adiabatic layer structure 300, which structure may significantly improve the adiabatic effect.

As shown in FIG. 15, a fourth conductive layer 302 is formed on the first preliminary adiabatic layer structure 300. The fourth conductive layer 302 may include nitrogen-containing metal, metal, metal silicide and/or the like. These can be used alone or in a combination thereof.

Referring now to FIG. 16, the fourth conductive layer 302 and the first preliminary adiabatic layer structure 300 are patterned to form a second adiabatic layer structure 300c and an upper electrode 302a. The third interlayer insulating layer 304 is formed on the second interlayer insulating layer 128 to cover the second preliminary adiabatic layer structure 300c and the upper electrode 302a. The third interlayer insulating layer 304 is partially etched to form a third contact hole exposing the upper electrode 302a. The third contact hole is filled with a conductive layer to form the third contact pad 308. The upper wiring line 306 is formed on the third interlayer insulating layer 304 and the third contact pad 308.

A lower portion of the second preliminary adiabatic layer structure is heated. For example, a current higher than that required for reading/writing data in the transistor may be applied to the lower electrode 132 to provide heat to the lower portion of the second preliminary adiabatic layer structure 300c. The heat may be sufficient for establishing a temperature of no less than a melting point of the second preliminary adiabatic layer structure 300c. As a result, as shown in FIG. 13, the lower portion of the second preliminary adiabatic layer structure 300c may be melted so that materials of the first and second adiabatic layer patterns 301a and 301b are reacted with each other, thereby changing the materials into the phase-changeable material of the programming layer pattern 310. A non-changed portion of the second preliminary adiabatic layer structure 300c corresponds to the adiabatic layer structure 301. In some embodiments, the first adiabatic layer 300a includes $Sb_2Te_3$ and the second adiabatic layer 300b includes GeTe and the programming layer pattern 310 includes $Ge_2Sb_2Te_5$.

According to some embodiments of the present invention, the adiabatic layer pattern serves to reduce the heat loss from the programming layer pattern so that abnormal program operation due to heat loss may be suppressed. Further, the adiabatic layer pattern may serve as to lower the height of the programming layer pattern so that the phase-changeable layer pattern may be changed during a read/write operation using a lower current. As a result, phase-changeable memory devices according to some embodiments of the present invention may have improved operation characteristics.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method of manufacturing a phase-changeable memory device, the method comprising:
    forming a lower electrode on a substrate;
    forming a first phase-changeable material layer on the lower electrode, wherein the first phase-changeable material layer comprises $Ge_2Sb_2Te_5$;
    forming a second phase-changeable material layer directly on the first phase-changeable material layer, the second phase-changeable material layer having a melting point higher than that of the first phase-changeable material layer;
    forming a conductive layer on the second phase-changeable material layer; and
    partially etching the conductive layer, the second phase-changeable material layer and the first phase-changeable layer to form an upper electrode, a second phase-changeable material layer pattern and a first phase-changeable material layer pattern, wherein forming the second phase-changeable material layer comprises:
    forming a first layer including a first chalcogenide that has a melting point higher than that of the first phase-changeable material layer, the first layer comprising GeTe; and
    forming a second layer on the first layer, the second layer including a second chalcogenide that has a thermal conductivity lower than that of the first phase-changeable material layer, wherein the second layer comprises $Sb_2Te_3$.

2. The method of claim 1, wherein the second phase-changeable material layer comprises a conductive material, the method further comprising:
    forming a transistor on the substrate, the transistor including a gate structure and first and second impurity regions; and
    forming a wiring line on the substrate, the wiring line configured to be electrically connected to the first impurity region,
    wherein forming the lower electrode comprises forming the lower electrode electrically connected to the second impurity region.

3. The method of claim 1, wherein the second phase-changeable material layer has a melting point higher than that of the first phase-changeable material layer by no less than about 50° C.

4. The method of claim 1, wherein the first and second phase-changeable material layers are formed in-situ in a same chamber.

5. The method of claim 1, wherein the first phase-changeable material layer comprises at least one material selected from the group consisting of an element in Group VA-antimony-tellurium that includes germanium-antimony-tellurium (Ge—Sb—Te), arsenic-antimony-tellurium (As—Sb—Te), tin-antimony-tellurium (Sn—Sb—Te), silicon-germanium-antimony-tellurium (Si—Ge—Sb—Te), tin-indium-antimony-tellurium (Sn—In—Sb—Te), nitrogen-germanium-antimony-tellurium (N—Ge—Sb—Te), arsenic-germanium-antimony-tellurium (As—Ge—Sb—Te), tantalum-antimony-tellurium (Ta—Sb—Te), niobium-antimony-tellurium (Nb—Sb—Te) and/or vanadium-antimony-tellurium (V—Sb—Te), an element in Group VA-antimony-selenium that includes tantalum-antimony-selenium (Ta—Sb—Se) niobium-antimony-selenium (Nb—Sb—Se) and/or vanadium-antimony-selenium (V—Sb—Se), an element in Group VIA-antimony-tellurium that includes tungsten-antimony-tellurium (W—Sb—Te), molybdenum-antimony-tellurium (Mo—Sb—Te) and/or chrome-antimony-tellurium (Cr—Sb—Te), and an element in Group VIA-antimony-selenium that includes tungsten-antimony-selenium (W—Sb—Se), molybdenum-antimony-selenium (Mo—Sb—Se) and/or chrome-antimony-selenium (Cr—Sb—Se).

6. The method of claim 1, wherein the first phase-changeable material layer comprises $Ge_2Sb_2Te_5$ and the second phase-changeable material layer comprises GeTe.

7. The method of claim 1, wherein the first and second layers are alternately and repeatedly stacked.

8. A method of manufacturing a phase-changeable memory device, the method comprising:

forming a transistor on a substrate, the transistor including a gate structure and first and second impurity regions;

forming a wiring line on the substrate, the wiring line configured to be electrically connected to the first impurity region;

forming a lower electrode on the substrate, the lower electrode configured to be electrically connected to the second impurity region;

forming a preliminary layer structure on the lower electrode, the preliminary layer structure including a first phase-changeable material layer and a second phase-changeable material layer, with the first and second phase-changeable material layers being alternately and repeatedly stacked;

forming a conductive layer on the preliminary layer structure;

partially etching the conductive layer and the first and second phase-changeable material layers to form a layer structure on the lower electrode;

heating a lower portion of the layer structure on the lower electrode that makes contact with the lower electrode to form a third phase-changeable material layer formed from heating of a material in the lower portion of the layer structure on the lower electrode; and forming an upper electrode on the layer structure on the lower electrode; wherein the first phase-changeable material layer comprises Ge2Sb2Te5 and the second Phase-changeable material layer comprises a first layer including GeTe and a second layer on the first layer, the second layer including Sb2Te3.

9. The method of claim 8, wherein heating the lower portion of the preliminary layer structure comprises applying a current to the lower portion of the preliminary layer structure through the lower electrode.

\* \* \* \* \*